(12) United States Patent
Zha et al.

(10) Patent No.: US 11,353,747 B2
(45) Date of Patent: Jun. 7, 2022

(54) BACKLIGHT MODULE AND LIQUID CRYSTAL DISPLAY

(71) Applicant: WUHAN CHINA STAR OPTOELECTRONICS TECHNOLOGY CO. LTD., Hubei (CN)

(72) Inventors: Guowei Zha, Hubei (CN); Changwen Ma, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/321,047

(22) PCT Filed: Dec. 26, 2018

(86) PCT No.: PCT/CN2018/123828
§ 371 (c)(1),
(2) Date: Jan. 28, 2019

(87) PCT Pub. No.: WO2020/087728
PCT Pub. Date: May 7, 2020

(65) Prior Publication Data
US 2021/0278726 A1    Sep. 9, 2021

(30) Foreign Application Priority Data

Oct. 31, 2018  (CN) .......................... 201811282377.5

(51) Int. Cl.
*G02F 1/1335*     (2006.01)
*G02F 1/13357*    (2006.01)
(Continued)

(52) U.S. Cl.
CPC .. *G02F 1/133612* (2021.01); *G02F 1/133603* (2013.01); *G02F 1/133605* (2013.01); *H01L 25/0753* (2013.01); *H01L 33/62* (2013.01)

(58) Field of Classification Search
CPC ......... G02F 1/133612; G02F 1/133603; G02F 1/133553; G02F 1/1335; H01L 25/0753; H01L 33/62
See application file for complete search history.

(56) References Cited

U.S. PATENT DOCUMENTS

2014/0204575 A1\*  7/2014  Jo ..................... G02F 1/133555
                                                        362/235
2016/0363815 A1   12/2016  Kim

FOREIGN PATENT DOCUMENTS

| CN | 101446701 A | 6/2009 |
| CN | 103939849 A | 7/2014 |
| CN | 107255886 A | 10/2017 |

\* cited by examiner

*Primary Examiner* — Joseph L Williams
*Assistant Examiner* — Jose M Diaz
(74) *Attorney, Agent, or Firm* — Mark M. Friedman

(57) ABSTRACT

A backlight module and a liquid crystal display are provided. The backlight module has a substrate, a plurality of soldering pads, and a reflective pattern layer. The soldering pads are distributed on the substrate and each of the soldering pads has a soldering pad size. The reflective pattern layer covers the soldering pads and the substrate. The reflective pattern layer has openings, positions of the openings correspond to positions of the soldering pads, each of the openings has an opening size, and the opening size is smaller than the corresponding soldering pad size. The backlight module is provided with the openings in the reflective pattern corresponding to the positions of the soldering pads, and the opening size of the openings is smaller than the soldering pad size of the soldering pads, thereby increasing a ratio of (Continued)

the reflective pattern layer to the substrate. Therefore, brightness is improved.

7 Claims, 6 Drawing Sheets

(51) Int. Cl.
*H01L 25/075* (2006.01)
*H01L 33/62* (2010.01)

//BACKLIGHT MODULE AND LIQUID CRYSTAL DISPLAY

FIELD OF DISCLOSURE

The present disclosure relates to displays, and more particularly, to a backlight module and a liquid crystal display.

BACKGROUND OF DISCLOSURE

In order to achieve requirements of a full screen, a side-entry light-injection scheme is limited on how much a side frame can be reduced. Generally, a connection area of a flexible circuit board needs to be reserved in a lower frame area, so a limit of a width of a bottom frame is substantially 2 to about 3 mm. Conversely, a direct-lit light-injection scheme does not need to reserve a connection area of the abovementioned flexible circuit board, so widths of upper, lower, left and right side frames can be further reduced.

Referring to FIGS. 1A and 1B, which are a cross-sectional schematic diagram and a top view of a conventional backlight module 10, respectively. In a current direct-lit light-injection scheme, because a light-emitting diode (not shown) and a pad 11 are non-reflective, it is necessary to provide a reflective layer 12 at a position where the light-emitting diode and the pad 11 are not provided to improve brightness. However, in order to avoid a process error when the reflective layer 12 is disposed to block the pad 11, the conventional technology defines a forbidden region 13 in which the reflective layer 12 is not disposed around the pad 11. However, the abovementioned manner causes a ratio of the reflective layer 12 to decrease, thereby lowering the brightness.

Therefore, it is necessary to provide a backlight module and a liquid crystal display to solve the problems existing in the conventional technology.

SUMMARY OF DISCLOSURE

From above, the present disclosure provides a backlight module and a liquid crystal display to solve a problem that the brightness of the backlight module and the liquid crystal display is insufficient due to a decrease in a proportion of the reflective layer.

An object of the present disclosure is to provide a backlight module, which is provided with a plurality of openings in the reflective pattern corresponding to the positions of the soldering pads, and an opening size of the openings is less than a soldering pad size of soldering pads, thereby increasing a ratio of a reflective pattern layer to the substrate. Therefore, a brightness is improved.

Another object of the present disclosure is to provide a liquid crystal display, which can include a backlight module in an embodiment of the present disclosure, so as to improve a display brightness of the liquid crystal display.

To achieve the above object of the present disclosure, an embodiment of the present disclosure provides a backlight module comprising a substrate, a plurality of soldering pads, a reflective pattern layer, and a plurality of light emitting diode chips. The plurality of soldering pads are distributed on the substrate and each of the plurality of soldering pads has a soldering pad size. The reflective pattern layer covers the plurality of soldering pads and the substrate, wherein the reflective pattern layer has a plurality of openings, positions of the plurality of openings correspond to positions of the plurality of soldering pads, each of the plurality of openings has an opening size, and the opening size is less than the corresponding soldering pad size. The plurality of light emitting diode chips are disposed on the plurality of soldering pads and electrically connected to the plurality of soldering pads through the corresponding openings, wherein each of the plurality of light emitting diode chips has a chip size, and the chip size is less than or equal to the corresponding opening size, wherein the backlight module is a direct-lit backlight module.

In an embodiment of the present disclosure, the chip size ranges from 100 to 500 micrometers.

In an embodiment of the present disclosure, the backlight module further comprises at least one optical layer covering the reflective pattern layer and the plurality of light emitting diode chips.

In an embodiment of the present disclosure, the at least one optical layer comprises at least one of a phosphor layer, a diffusion layer and a brightness enhancement layer.

In an embodiment of the present disclosure, the soldering pad size ranges from 600 to 1000 micrometers.

In an embodiment of the present disclosure, the opening size ranges from 100 to 500 micrometers.

To achieve the above object of the present disclosure, an embodiment of the present disclosure provides a backlight module comprising a substrate, a plurality of soldering pads, and a reflective pattern layer. The plurality of soldering pads are distributed on the substrate and each of the plurality of soldering pads has a soldering pad size. The reflective pattern layer covers the plurality of soldering pads and the substrate, wherein the reflective pattern layer has a plurality of openings, positions of the plurality of openings correspond to positions of the plurality of soldering pads, each of the plurality of openings has an opening size, and the opening size is less than the corresponding soldering pad size.

In an embodiment of the present disclosure, the backlight module further comprises a plurality of light emitting diode chips disposed on the plurality of soldering pads and electrically connected to the plurality of soldering pads through the corresponding openings, wherein each of the plurality of light emitting diode chips has a chip size, and the chip size is less than or equal to the corresponding opening size.

In an embodiment of the present disclosure, the chip size ranges from 100 to 500 micrometers.

In an embodiment of the present disclosure, the backlight module further comprises at least one optical layer covering the reflective pattern layer and the plurality of light emitting diode chips.

In an embodiment of the present disclosure, the at least one optical layer comprises at least one of a phosphor layer, a diffusion layer and a brightness enhancement layer.

In an embodiment of the present disclosure, the backlight module is a direct-lit backlight module.

In an embodiment of the present disclosure, the soldering pad size ranges from 600 to 1000 micrometers.

In an embodiment of the present disclosure, the opening size ranges from 100 to 500 micrometers.

Further, another embodiment of the present disclosure provides a liquid crystal display comprising a backlight module described above.

DETAILED DESCRIPTION OF PREFERRED EMBODIMENTS

Following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, horizontal, vertical, longitudinal, axial, radial, an uppermost layer or a lowermost layer, etc., only refer to a direction of the accompanying figures, Therefore, the used directional terms are used to describe and understand the present disclosure, but the present disclosure is not limited thereto.

Figure 1A:
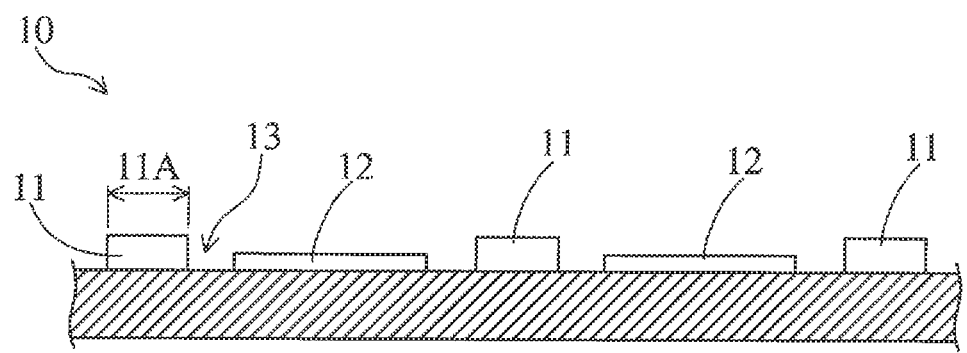
FIG. 1A is a cross-sectional schematic diagram of a conventional backlight module.
Figure 1B:
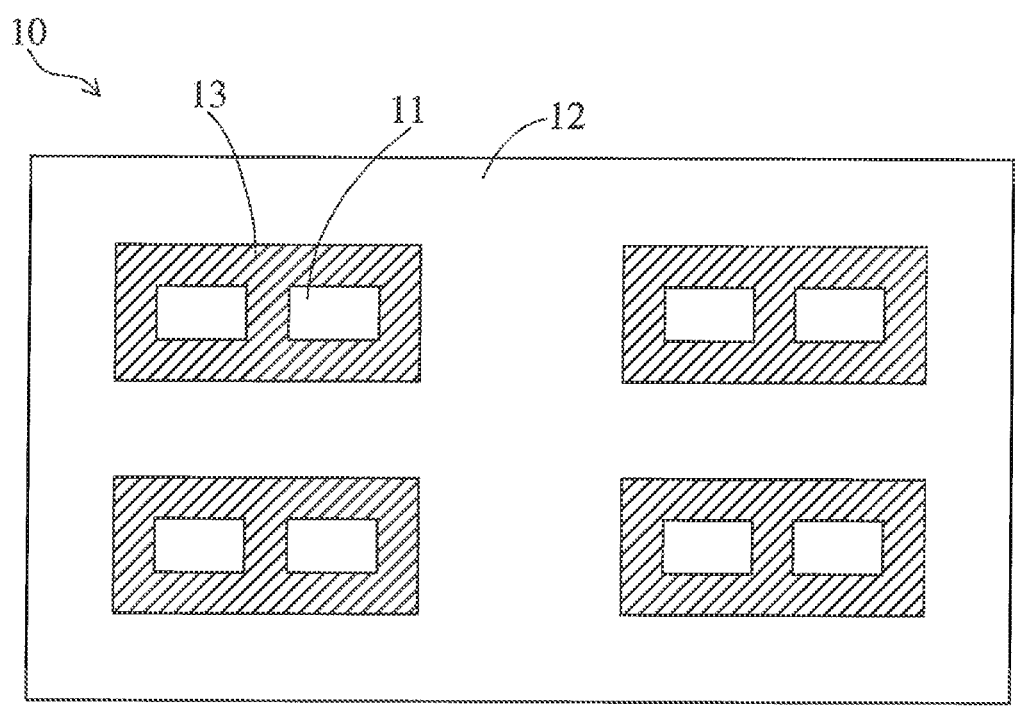
FIG. 1B is a top-view schematic diagram of a conventional backlight module.
Figure 2A:
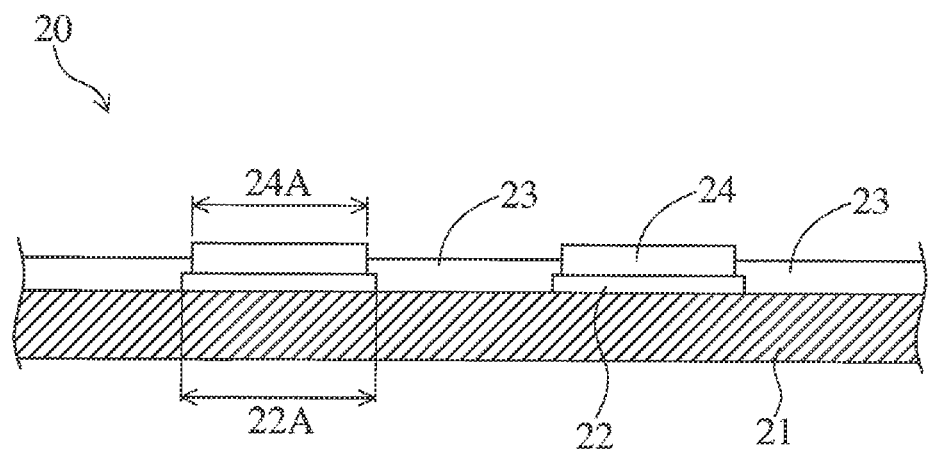
FIG. 2A is a cross-sectional schematic diagram of a backlight module in an embodiment of the present disclosure.
Figure 2B:
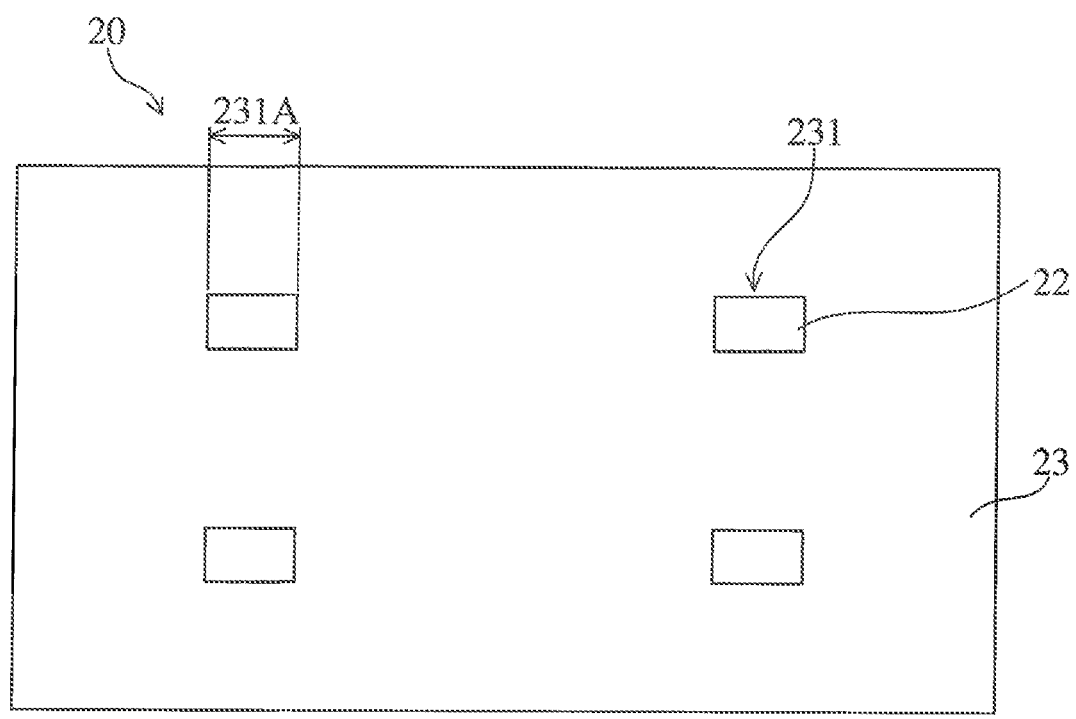
FIG. 2B is a top-view schematic diagram of a backlight module in an embodiment of the present disclosure.
Figure 2C:
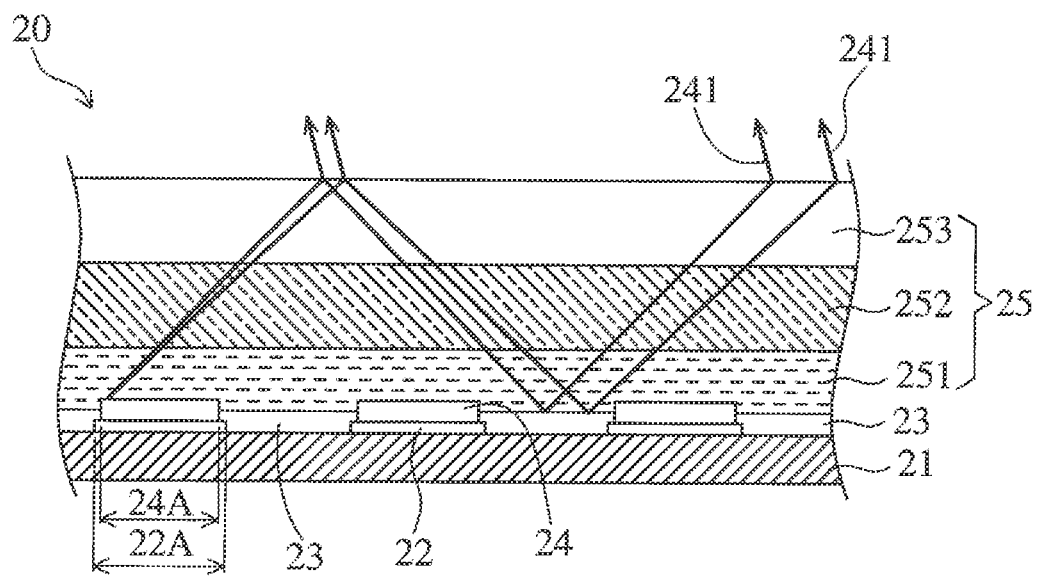
FIG. 2C is a cross-sectional schematic diagram of a backlight module in another embodiment of the present disclosure.

Referring to FIG. 2A together with FIG. 2. FIG. 2A is a cross-sectional schematic diagram of a backlight module 20 in an embodiment of the present disclosure, and FIG. 26 is a top-view schematic diagram of a backlight module 20 in an embodiment of the present disclosure, where a light emitting diode chip 24 is not shown in FIG. 28. The backlight module 20 according to an embodiment of the present disclosure is, for example, a direct-lit backlight module. The backlight module 20 mainly includes a substrate 21, a plurality of soldering pads 22, and a reflective pattern layer 23. The substrate 21 may support components of the backlight module 20, such as the plurality of pads 22 and the reflective pattern layer 23, or other components. In an embodiment, the substrate 21 is, for example, a flexible substrate or a rigid substrate. In one example, the flexible substrate is, for example, a flexible circuit board. In another example, the rigid substrate is, for example, a rigid circuit board. In another embodiment, the flexible circuit board or the rigid circuit board may include a protective layer, a first copper wire pattern layer, an insulating spacer layer, and a second copper wire pattern from bottom to top sequentially.

The backlight module 20 according to an embodiment of the present disclosure includes the plurality of soldering pads 22 distributed on the substrate 21 and each of the plurality of soldering pads 22 having a soldering pad size 22A. In an embodiment, a bottom of the plurality of pads 22 may be electrically connected to the substrate 21 (e.g., the flexible circuit board or the rigid circuit board). In another embodiment, the soldering pad size 22A is greater than a soldering pad size used in prior art. Specifically, please refer to FIG. 1A to FIG. 2B together. In the prior art, because a forbidden area 13 needs to be defined around a soldering pad 11, and a soldering pad 13 itself is not a reflector, the soldering pad 13 tends to be produced in a small size. In contrast, the backlight module 20 of an embodiment of the present disclosure is an enlarged pad size 22A (for example, if the soldering pad 11 of the prior art has a size between 100 and 500 micrometers, the soldering pad size 22A of the embodiment of the present disclosure is between 600 and 1000 micrometers), and a reflection effect is enhanced by an arrangement of the reflective pattern layer 23, thereby improving the brightness. For details, please refer to the description in the following paragraphs. In an embodiment, the soldering pad size 22A is, for example, 650 micrometers, 700 micrometers, 750 micrometers, 800 micrometers, 850 micrometers, 900 micrometers, or 950 micrometers.

The backlight module 20 according to an embodiment of the present disclosure includes the reflective pattern layer 23 covering the plurality of soldering pads 22 and the substrate 21, wherein the reflective pattern layer 23 has a plurality of openings 231, positions of the plurality of openings 231 correspond to positions of the plurality of soldering pads 22, each of the plurality of openings 231 has an opening size 231A, and the opening size 231A is smaller than the corresponding soldering pad size 22A. In one embodiment, the reflective pattern layer 23 is a white reflective layer, which has a primary function of providing electrical isolating and improving light reflectance. The reflective pattern layer 23 may be a white pigment resin mixing layer commonly used in a field of backlight modules, or may be a composite optical reflective layer having a plurality of inorganic film layers. In one example, material of the reflective pattern layer 23 is, for example, a mixture of liquid hydrocarbons formed by refining petroleum.

It is to be mentioned here that the opening size 231A is, for example, a soldering pad size corresponding to the prior art. For example, the prior art soldering pad size 11A is between 100 and 500 micrometers, and the opening size 231A of an embodiment of the present disclosure is also between 100 and 500 micrometers (e.g., 150 micrometers, 200 micrometers, 250 micrometers, 300 micrometers, 350 micrometers, 400 micrometers or 450 micrometers). It is to be noted that at least a portion of each of the plurality of soldering pads 22 of an embodiment of the present disclosure (e.g., edges of the plurality of soldering pads 22) is covered by the reflective pattern layer 23. Further, a remaining portion of the plurality of soldering pads 22 is exposed through the plurality of openings 231. In an embodiment, the backlight module 20 may include a plurality of light emitting diode chips 24, and the plurality of light emitting diode chips 24 are disposed on the plurality of soldering pads 22 and are electrically connected, for example, through the plurality of openings 231. The plurality of soldering pads 22, wherein each of the plurality of light-emitting diode (LED) chips 24 has a chip size 24A smaller than or equal to the corresponding opening size. The plurality of light emitting diode chips 24 may emit light 241, and the light 241 may be reflected by the reflective pattern layer 23 to improve brightness of the backlight module 20. In one example, the chip size 24A is between 100 and 500 micrometers (e.g., 150 micrometers, 200 micrometers, 250 micrometers, 300 micrometers, 350 micrometers, 400 micrometers, or 450 micrometers).

Further, a relationship among the soldering pad size 22A, the corresponding opening size 231A, and the corresponding chip size 24A is illustrated. First, the opening size 231A is associated with the chip size 24A, that is, the opening size 231A is designed according to the chip size 24A. For example, when the chip size 24A is 300 micrometers, the opening size 231A can be 300 micrometers or more. In a preferred example, the chip size 24A is equal to the opening size 231A to avoid a decrease in a ratio of the reflective layer 12. After determining the opening size 231A, the soldering pad size 22A is determined. For example, when the opening size 231A is 300 microns, the soldering pad size 22A may be 700 micrometers. As can be seen from the above, the pad size 22A, the corresponding opening size 231A, and the corresponding chip size 24A can be appropriately adjusted according to requirements.

From above, the backlight module 20 of an embodiment of the present disclosure is to enlarge the soldering pad size and to define an exposed area of the plurality of soldering pads 22 by the reflective pattern layer 23, such that it is possible to ensure that the plurality of soldering pads 22 are not covered by the reflective pattern layer 23 under a premise of no forbidden area 13 being provided. Moreover, since the forbidden area 13 is not required to be provided, the brightness of the backlight module 20 of an embodiment of the present disclosure can be improved.

Refer to FIG. 20, which is a cross-sectional schematic diagram of a backlight module 20 in another embodiment of the present disclosure. In an embodiment, the backlight module 20 further includes at least one optical layer 25 covering the reflective pattern layer 23 and the plurality of light emitting diode chips 24. In one example, the at least one optical layer includes at least one of a phosphor layer 251 (e.g., including transparent silica gel and phosphor particles), a diffusion layer 252 and a brightness enhancement layer 253. It is to be noted that material and manufacturing methods of the phosphor layer 251, the diffusion layer 252, and the brightness enhancing layer 253 can be referred to, for example, material and manufacturing methods of a phosphor layer, a diffusion layer, and a brightness enhancement used in a general backlight module, which is not repeated again.

Figure 3:
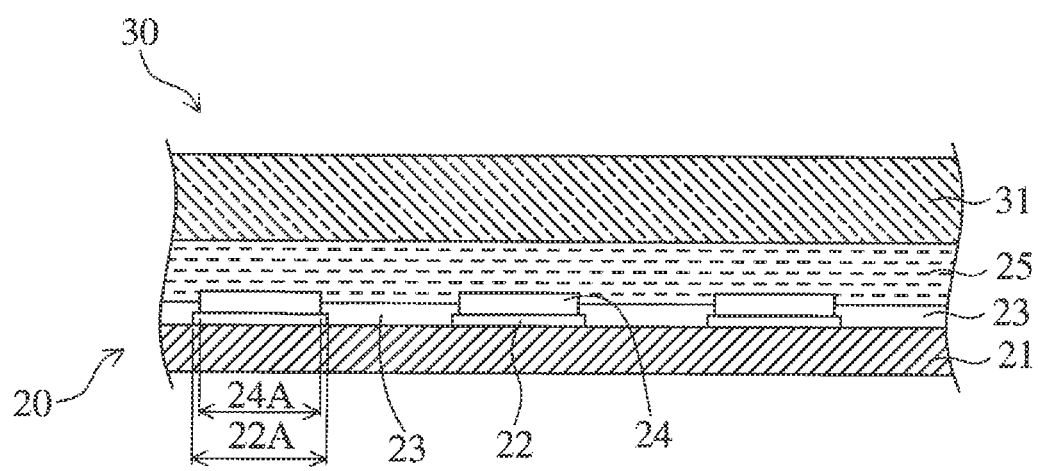
FIG. 3 is a cross-sectional schematic diagram of a liquid crystal display in an embodiment of the present disclosure.

Refer to FIG. 3, which is a cross-sectional schematic diagram of a liquid crystal display 30 in an embodiment of the present disclosure. The liquid crystal display 30 includes the backlight module 20 of any one of the above mentioned embodiments. In an embodiment, the liquid crystal display 30 may further include other components of a general liquid crystal display, such as a display module 31, wherein light generated by the backlight module 20 may pass through the display module 31 to display an image or a video of the liquid crystal display 20.

From above, the liquid crystal display 30 of the embodiment of the present disclosure uses the backlight module 20 described above. The backlight module 20 is to enlarge the soldering pad size and to define an exposed area of the plurality of soldering pads 22 by the reflective pattern layer 23, such that it is possible to ensure that the plurality of soldering pads 22 are not covered by the reflective pattern layer 23 under a premise of no forbidden area 13 being provided. Moreover, since the forbidden area 13 is not required to be provided, the brightness of the backlight module 20 can be improved. Therefore, the brightness of the liquid crystal display 30 in an embodiment of the present disclosure including the backlight module 20 is improved.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

The invention claimed is:

1. A backlight module, comprising:
a substrate;
a plurality of soldering pads distributed on the substrate and each of the plurality of soldering pads having a soldering pad size;
a reflective pattern layer covering the plurality of soldering pads and the substrate, wherein the reflective pattern layer has a plurality of openings, positions of the plurality of openings correspond to positions of the plurality of soldering pads, each of the plurality of openings has an opening size, and the opening size is smaller than the corresponding soldering pad size; and
a plurality of light emitting diode chips disposed on the plurality of soldering pads and electrically connected to the plurality of soldering pads through the corresponding openings, wherein each of the plurality of light emitting diode chips has a chip size, and the chip size is equal to the corresponding opening size,
wherein the backlight module is a direct-lit backlight module;
wherein the chip size ranges from 100 to 500 micrometers; and
wherein the soldering pad size ranges from 600 to 1000 micrometers.

2. The backlight module according to claim 1, further comprising at least one optical layer covering the reflective pattern layer and the plurality of light emitting diode chips.

3. The backlight module according to claim 2, wherein the at least one optical layer comprises at least one of a phosphor layer, a diffusion layer, and a brightness enhancement layer.

4. A backlight module, comprising:
a substrate;
a plurality of soldering pads distributed on the substrate and each of the plurality of soldering pads having a soldering pad size; and
a reflective pattern layer covering the plurality of soldering pads and the substrate, wherein the reflective pattern layer has a plurality of openings, positions of the plurality of openings correspond to positions of the plurality of soldering pads, each of the plurality of openings has an opening size, and the opening size is smaller than the corresponding soldering pad size;
a plurality of light emitting diode chips disposed on the plurality of soldering pads and electrically connected to the plurality of soldering pads through the corresponding openings, wherein each of the plurality of light emitting diode chips has a chip size, and the chip size is equal to the corresponding opening size;
wherein the chip size ranges from 100 to 500 micrometers; and
wherein the soldering pad size ranges from 600 to 1000 micrometers.

5. The backlight module according to claim 4, further comprising at least one optical layer covering the reflective pattern layer and the plurality of light emitting diode chips.

6. The backlight module according to claim 5, wherein the at least one optical layer comprises at least one of a phosphor layer, a diffusion layer, and a brightness enhancement layer.

7. A liquid crystal display, comprising a backlight module according to claim 4.

* * * * *